(12) United States Patent
Dettmer

(10) Patent No.: US 6,978,009 B1
(45) Date of Patent: Dec. 20, 2005

(54) MICROPROCESSOR-CONTROLLED FULL-DUPLEX SPEAKERPHONE USING AUTOMATIC GAIN CONTROL

(75) Inventor: David Ray Dettmer, Austin, TX (US)

(73) Assignee: Legerity, Inc., Austin, TX (US)

( * ) Notice: Subject to any disclaimer, the term of this patent is extended or adjusted under 35 U.S.C. 154(b) by 1104 days.

(21) Appl. No.: 08/699,844

(22) Filed: Aug. 20, 1996

(51) Int. Cl.[7] ............................................. H04M 9/08
(52) U.S. Cl. ........................ 379/388.03; 379/388.06; 379/390.01; 379/406.07
(58) Field of Search ................................ 379/390, 388, 379/389, 391, 420, 410, 406, 408, 409; 381/104, 381/106; 455/550, 554, 560, 561; 370/528

(56) References Cited

U.S. PATENT DOCUMENTS

| | | | |
|---|---|---|---|
| 3,953,676 A * | 4/1976 | Brown .................. | 379/388.06 |
| 4,286,177 A | 8/1981 | Hart et al. ................ | 307/296 |
| 4,491,694 A | 1/1985 | Harmeyer .................. | 379/442 |
| 4,513,177 A * | 4/1985 | Nishino et al. ......... | 379/388.06 |
| 4,629,829 A * | 12/1986 | Puhl et al. .................. | 379/390 |
| 4,714,842 A | 12/1987 | Hart et al. .................. | 307/459 |
| 4,715,063 A * | 12/1987 | Haddad et al. ............ | 379/390 |
| 4,741,018 A | 4/1988 | Portratz et al. ............. | 381/106 |
| 4,843,621 A * | 6/1989 | Potratz ...................... | 379/390 |
| 4,928,306 A | 5/1990 | Biswas et al. .............. | 379/390 |
| 5,075,687 A * | 12/1991 | Chen et al. ............ | 379/406.07 |
| 5,134,658 A | 7/1992 | Chen et al. ................ | 381/110 |
| 5,187,741 A | 2/1993 | Erving et al. ............... | 379/388 |
| 5,297,203 A * | 3/1994 | Rose et al. .................. | 370/528 |
| 5,357,567 A * | 10/1994 | Barron et al. .......... | 379/406.06 |
| 5,384,807 A | 1/1995 | Yatim et al. .................. | 375/27 |
| 5,471,528 A | 11/1995 | Reesor ....................... | 379/390 |
| 5,535,433 A | 7/1996 | Kurokawa et al. .......... | 379/390 |

(Continued)

FOREIGN PATENT DOCUMENTS

| | | | | |
|---|---|---|---|---|
| GB | 2 161 047 A | | 1/1986 | |
| GB | 2 174 578 A | | 11/1986 | |
| GB | 2174578 A | * | 11/1986 | ............ H04B 3/20 |

OTHER PUBLICATIONS

McNamara, John E., Technical Aspects of Data Communication, Digital Press, Jul. 1979, p. 362.*
Appendix to U.S. Appl. No. 07/930,254, filed Aug. 14, 1992 (Appendix cancelled before issue as US Patent 5,357,567).*
Intel, 80C186EA/80C188EA Microprocessor User's Manual, 1995, pp. 9-16 through 9-20.*
Webster's Ninth New Collegiate Dictionary, Merriam-Webster, 1990, p. 992.*

Primary Examiner—Forester W. Isen
Assistant Examiner—Daniel Swerdlow

(57) ABSTRACT

A near full duplex portable handset speakerphone comprises: a microprocessor; a hands-free receive register connected to the microprocessor; a hands-free transmit register connected to the microprocessor; a ROM having a speakerphone operation algorithm, the ROM connected to the microprocessor; a first analog-to-digital converter connected to the hands-free receive register; a second analog-to-digital converter connected to the hands-free transmit register; a first programmable digital attenuator connected to the microprocessor and to a speaker; and a second programmable digital attenuator connected to the microprocessor and to a microphone, wherein near full duplex communication is achieved without digital signal processing. In another feature of the invention, the hands-free registers provide a digital representation of the speech volume in each direction to the microprocessor. The microprocessor monitors the speech signal levels, calculates digital volume comparisons in order to make speech gain decisions for optimal sound, and digitally adjusts the gains in the two speech paths to the upper half of their maximum values.

6 Claims, 10 Drawing Sheets

U.S. PATENT DOCUMENTS

| | | | |
|---|---|---|---|
| 5,553,137 A | * | 9/1996 | Nyhart et al. ............... 379/410 |
| 5,668,794 A | * | 9/1997 | McCaslin et al. ...... 379/406.07 |
| 5,668,871 A | * | 9/1997 | Urbanski .................... 379/390 |
| 5,692,042 A | * | 11/1997 | Sacca ........................ 379/388 |
| 5,722,086 A | * | 2/1998 | Teitler et al. ............... 455/561 |
| 5,768,364 A | * | 6/1998 | Karnowski et al. ......... 379/388 |

* cited by examiner

| Gain Control Register | Value Written | Gain Setting |
|---|---|---|
| Mic. Pre-Amp. | 90$_H$ | +18dB |

| Gain Control Register | Value Written | RX Gain | Substate | TX Gain | Value Written | Gain Control Register |
|---|---|---|---|---|---|---|
| RX Attenuation | 20$_H$ | −12dB | 40/60 | −9dB  | 20$_H$ | TX Attenuation |
| RX Attenuation | 20$_H$ | −12dB | 50/50 | −12dB | 20$_H$ | TX Attenuation |
| RX Attenuation | 20$_H$ | −9dB  | 60/40 | −12dB | 20$_H$ | TX Attenuation |

400

500

MICROPROCESSOR-CONTROLLED FULL-DUPLEX SPEAKERPHONE USING AUTOMATIC GAIN CONTROL

BACKGROUND OF THE INVENTION

The invention relates to wireless speakerphones, and more particularly, to a microprocessor-controlled full-duplex speakerphone using automatic gain control. There are two basic types of speakerphones available on the market today: A lower-cost, half-duplex design aimed at the consumer market, and an expensive full-duplex DSP implementation for business applications. The major technical obstacle to overcome in designing a speakerphone is the prevention of unstable feedback (howling, or squealing) caused by adjusting the speaker and/or microphone gains too high. The first solution to this problem was the half-duplex speakerphone.

In the receive direction (the far-end person is heard via the speaker), it is obviously desirable to provide a relatively large gain on the speaker, but due to the proximity of the microphone to the speaker in the speakerphone enclosure, the microphone will detect the far-end person's voice and amplify it back to the far-end. This acoustic coupling is the source of half of the feedback loop in the speakerphone, and results in an annoyingly high level of sidetone in the far-end handset. To mitigate this acoustic coupling, the half-duplex speakerphone reduces the gain of the microphone to its minimum when the far-end person is talking, so that none of the far-end person's voice is returned back.

In the transmit direction (the near-end person speaks into the microphone), it is obviously desirable to provide a relatively large gain on the microphone to allow greater distances between the person speaking and the microphone. However, due to the electrical connection of the microphone to the telephone lines (via the 2-wire to 4-wire hybrid interface), a part of the transmitted voice signal is reflected back into the RX speech path, which is then amplified by the speaker driver with the result that the near-end person's own voice is amplified into the room. This hybrid sidetone is the second half of the feedback loop in the speakerphone, and is the natural way typical telephone handsets provide sidetone from microphone to the earpiece (the microphone gain contributes to the sidetone level). To mitigate this hybrid sidetone, the half-duplex speakerphone reduces the gain of the speaker to its minimum when the near-end person is talking, so that none of the near-end person's voice is amplified into the same room.

Whenever the microphone and speaker gains are not balanced in this "see-saw" minimum/maximum way, the familiar acoustic feedback sound (howling, squealing) can easily result from the completed feedback loop provided by the acoustic coupling and hybrid sidetone audio paths. This "see-saw" gain adjustment process requires the speakerphone to determine which person is talking, and it must arbitrate the two signal paths accordingly. These functions are typically provided by an expensive analog voice-switched speakerphone chip, but the arbitration typically suffers from several basic disadvantages:

The speakerphone gives priority to the loudest person speaking when both people are attempting to speak simultaneously, for example, when one person is trying to interrupt the other. This is a disadvantage for the case of a weak signal from a distant phone, or from a person who is not sitting very close to the speakerphone. In these cases it may be necessary for the far-end person to unnaturally shout into the handset, or for a person at the far end of the table to temporarily move closer to the speakerphone.

The slow switching time during this volume comparison usually results in the loss of a few syllables at the beginning of the interruption, which generally results in the person having to repeat the whole sentence.

The full-duplex DSP-based speakerphone implements robust signal cancellation of the two speech paths to eliminate the coupling of the two channels. As a result, the microphone and speaker gains can be maintained at high levels throughout the conversation, thus eliminating the voice switching altogether. However, this high quality demands a high price because 1) it requires a powerful DSP engine capable of performing these calculations on both speech paths at the 8 kHz sample rate, and 2) the algorithm requires considerable DSP and audio experience.

The user-controlled volume setting is typically implemented in hardware in an analog speakerphone via a potentiometer, but suffers from degraded audio quality over time due to dust in the potentiometer mechanism and DC offset drift. Typical cordless phone designs house the speakerphone function in the base station. The disadvantage of this configuration is the obvious one: the speakerphone functions are limited by the length of the wires connecting the base station to the telephone jack and to the power.

In view of the foregoing, what is needed is a speakerphone which allows a full-duplex conversation, i.e.: simultaneous speaking and hearing, without an external analog speakerphone chip and a DSP engine, without external analog decoders with resistor ladders for providing gain, and without using a potentiometer for user-controlled volume control. Furthermore, the speakerphone functions should be housed in the portable handset.

SUMMARY OF THE INVENTION

A near full duplex portable handset speakerphone comprises: a microprocessor; a hands-free receive register connected to the microprocessor; a hands-free transmit register connected to the microprocessor; a ROM having a speakerphone operation algorithm, the ROM connected to the microprocessor; a first analog-to-digital converter connected to the hands-free receive register; a second analog-to-digital converter connected to the hands-free transmit register; a first programmable digital attenuator connected to the microprocessor and to a speaker; and a second programmable digital attenuator connected to the microprocessor and to a microphone, wherein near full duplex communication is achieved without digital signal processing.

In another feature of the invention, the hands-free registers provide a digital representation of the speech volume in each direction to the microprocessor. The microprocessor monitors the speech signal levels, calculates digital volume comparisons in order to make speech gain decisions for optimal sound, and digitally adjusts the gains in the two speech paths to the upper half of their maximum values.

DESCRIPTION OF THE PREFERRED EMBODIMENT

Figure 1:
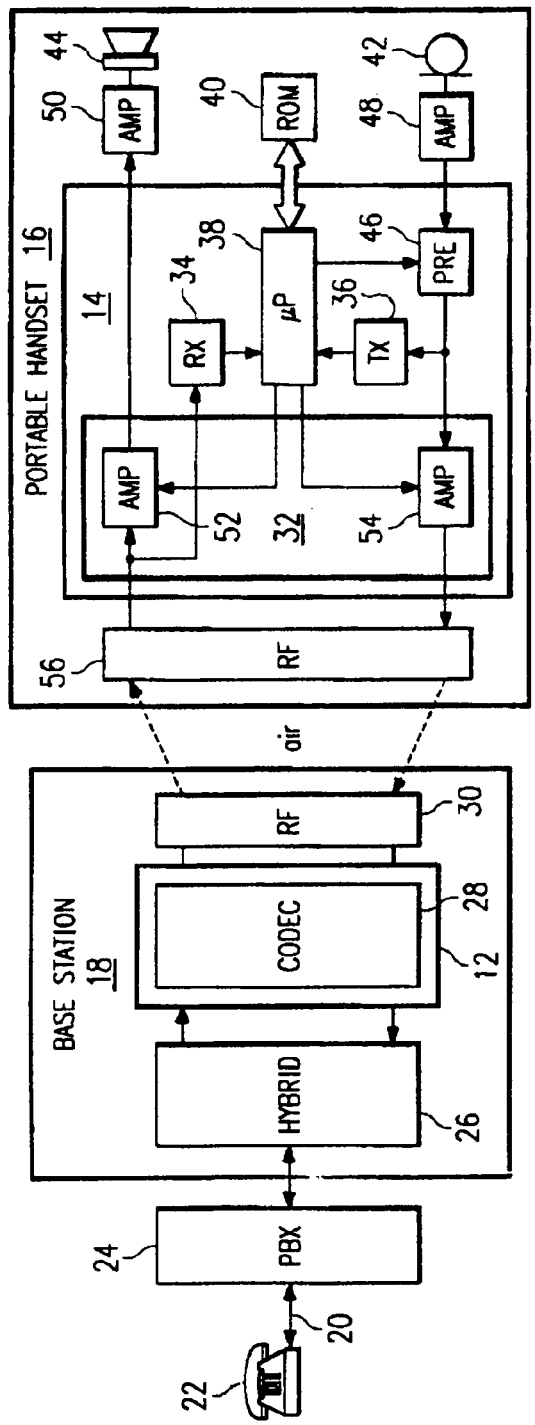
FIG. 1 is a block diagram of a wireless speakerphone system 10 built according to the present invention.

In FIG. 1 a wireless speakerphone system 10, built according to the present invention, uses a pair of integrated circuit controller chips 12, 14 to provide a digital wireless voice link between a portable handset 16 and a base station 18. A signal 20 from a far-end telephone 22 is received by a PBX or a telephone central office 24. The office 24 transmits the signal 20 to the base station 18. In addition to the controller chip 12 mentioned above, the base station 18 also includes a hybrid 26, which is a telephone line interface (a 2-wire to 4-wire hybrid interface). The controller chip 12 includes a codec 28, which is a coder/decoder of signals. The codec 28 serves as the analog interface to the telephone line. The base station 18 further includes an RF 30, which is a radio frequency interface.

Referring now to the portable handset 16, it includes the speakerphone functionality, rather than having such functionality included in the base station 18. The user makes the usual decision to enable either the handset's earpiece and microphone (not shown in FIG. 1), or the "hands-free" speakerphone interface (consisting of blocks 50, 44, 48, 42 in FIG. 1) for the telephone conversation. A codec 32 in the controller chip 14 handles the analog speakerphone interface. The controller chip 14 further includes an embedded hands-free receive register RX 34 and an embedded hands-free transmit register TX 36 in its speech paths.

A microprocessor $\mu P$ 38 controls the functioning of the controller chip 14. A read-only memory ROM 40 houses a speakerphone algorithm 41, not shown. A microphone Mic 42 picks up the speech of the user, and a speaker 44 delivers the far-end user's speech to the user of the portable handset 16. A pre-amplifier PRE 46 provides programmable gain of either +3 dB or +18 dB. The amplifiers AMP 48, 50 external to the controller chip 14 are analog amplifiers. The AMP amplifiers (RX attenuation register 52 and TX attenuation register 54) internal to the controller chip 14 are programmable digital attenuators providing 0 dB to −42 dB gain, and mute. The portable handset 16 also includes a radio frequency interface RF 56.

Although hands-free registers exist in both of the identical controller chips 12 and 14, hands-free registers in the controller chip 12 are not used, because the speakerphone algorithm executes solely in the portable handset 16.

The speakerphone algorithm 41 includes three sequential tasks performed by the on-chip $\mu P$ 38: reading the hands-free registers and determining the peak volume levels of both speech paths; executing a speakerphone state machine 60 (shown in FIG. 2); and digitally adjusting the microphone and speaker gains as directed by the speakerphone state machine. The speakerphone algorithm 41 uses timers and peak detection as its two basic pillars. The timers are the first basic pillar which forms the foundation of the speakerphone algorithm 41. The timers fall into three categories: a) a 125 $\mu s$ frame timer or variable, b) a 20 ms state machine variable, and c) a 160 ms hold variable and a 80 ms duplex variable. The 125 $\mu s$ frame variable is the only variable which is implemented in hardware. The 125 $\mu s$ frame variable generates a hardware interrupt to the $\mu P$ 38 on every speech frame so that one of the hands-free registers 34, 36 can be read by a software peak detector.

The 20 ms state machine variable is a RAM Sample_Counter variable which is implemented in the interrupt service routine for the 125 $\mu s$ frame variable. The RAM Sample_Counter variable is incremented by one each time the interrupt service routine is called (every 125 $\mu s$), and when it reaches 160 (20 ms), the value is cleared and the Do_HF boolean flag is set. This flag is polled by the main wireless telephone control program, and when set, causes execution of the hands-free speakerphone algorithm 41. Thus the speakerphone algorithm is executed once every 20 ms, which means that the peak detection window is 20 ms, and the speakerphone state machine 60 either remains in the same state or advances to a new state every 20 ms.

The 160 ms hold variable is a software timer which is implemented inside the speakerphone state machine 60 by the use of a RAM Hold_Time variable. The RAM Hold_Time variable holds the state machine 60 in the current state before it enters the idle state, i.e.: it adds a delay between the active RX, TX, or full-duplex states and the idle state. This empirically-derived delay prevents the state machine 60 from jumping between the active states and the idle state during the short quiet gaps and pauses in normal speech. The Hold_Time variable is initialized to 160 ms upon entry into the RX, TX, and full-duplex states, and is used in conjunction with the duplex variable.

The 80 ms software duplex timer is implemented inside the speakerphone state machine 60 by the use of a RAM Duplex_Time variable. The primary purpose of this variable is to prevent an abrupt change in duplex when both people are talking at (nearly) the same time. For example, it would be very undesirable for the speakerphone to oscillate between the RX and TX states when both people are talking. Instead the duplex variable holds the state machine 60 in the full-duplex state during the short quiet gaps and pauses in both people's normal speech. The Duplex_Time variable is initialized to 80 ms upon entry into the RX, TX and full-duplex states, and is used in conjunction with the hold variable as follows.

Figure 2:
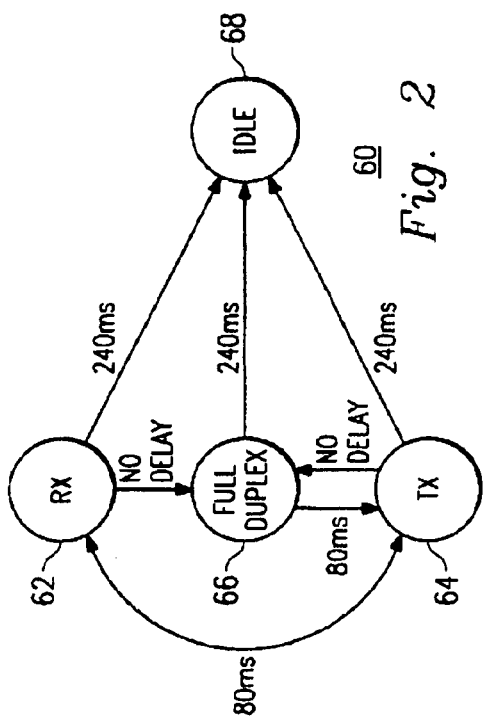
FIG. 2 is a diagram of the state machine 60 of the speakerphone algorithm 41, showing timer-controlled state transitions.

Referring now to FIG. 2, the state machine 60 is a software routine which has memory of its past state, the current state, and its future states by means of state variables stored in RAM. The state machine 60 makes its decisions by executing software instructions. Electronic state machines are either typically implemented in hardware (by flip-flops or latches) or in software (by a routine which operates on state variables stored in RAM). In the preferred embodiment, the state machine 60 is implemented in software. The inputs to the speakerphone state machine 60 are comprised of the peak volume levels of both speech paths together with the current microphone and speaker gain settings. The speakerphone state machine 60 compares the peak volume levels of both speech paths to pre-defined threshold levels, monitors the current microphone and speaker gain settings, and finally determines the optimum gain settings for the present volume levels. The speakerphone state machine 60 consists of 4 operating states: a RX 62, a TX 64, a full-duplex 66, and idle state 68.

FIG. 2 shows how the Hold_Time variable and the Duplex_Time variable are used in conjunction to provide the state transition delays. Specifically, the hold and duplex variables are initialized to 160 ms and 80 ms respectively by loading the Hold_Time variable with a value of 8, and by loading the Duplex_Time variable with a value of 4. On each execution pass of the speakerphone state machine 60 (every 20 ms), both of these variables are either reloaded with their initial values, or one of them decremented by 1, depending on the decision made by the state machine 60. If the state machine 60 detects sufficient volume in the RX and/or TX speech paths to enter or to remain in one of the active states (RX 62, TX 64, or full-duplex 66), both variables are reloaded with their initial values. If insufficient volume is present in the RX speech path, the duplex variable is decremented by 1 in preparation for the pending state transition to the TX state 64. When the duplex variable is decremented to 0 (after 4 passes), the state machine 60 enters the TX state 64 and both variables are initialed. If insufficient volume is present in the TX speech path, the duplex variable is decremented by 1 in preparation for the pending state transition to the RX state 62. When the duplex variable is decremented to 0 (after 4 passes), the state machine 60 enters the RX state 62 and both variables are initialed. If insufficient volume is present in both speech paths, the state machine 60 will enter an idle state 68 after both variables are decremented to 0: the duplex variable is decremented to 0 first (after 4 passes), then the hold variable is decremented by 1. When the hold variable is also decremented to 0, twelve total execution passes of the state machine 60 have elapsed, and the state machine 60 enters the idle state 68.

The peak detector algorithm 70 is the second basic pillar which forms the foundation of the speakerphone algorithm 41. The most basic piece of information needed by the speakerphone algorithm 41 is the relative volume of the two speech paths. The transmit and receive speech paths of the controller 14 are conveyed by the codec 32, whose sample rate is the standard frame rate of 8 kHz, so the hands-free registers 34, 36 are updated with fresh values every 125 $\mu$s. Because these registers return the current digital magnitude of the two speech paths at the instant they are read, a software peak detector algorithm 70 is necessary to determine the maximum signal level during a given time.

Figure 3:
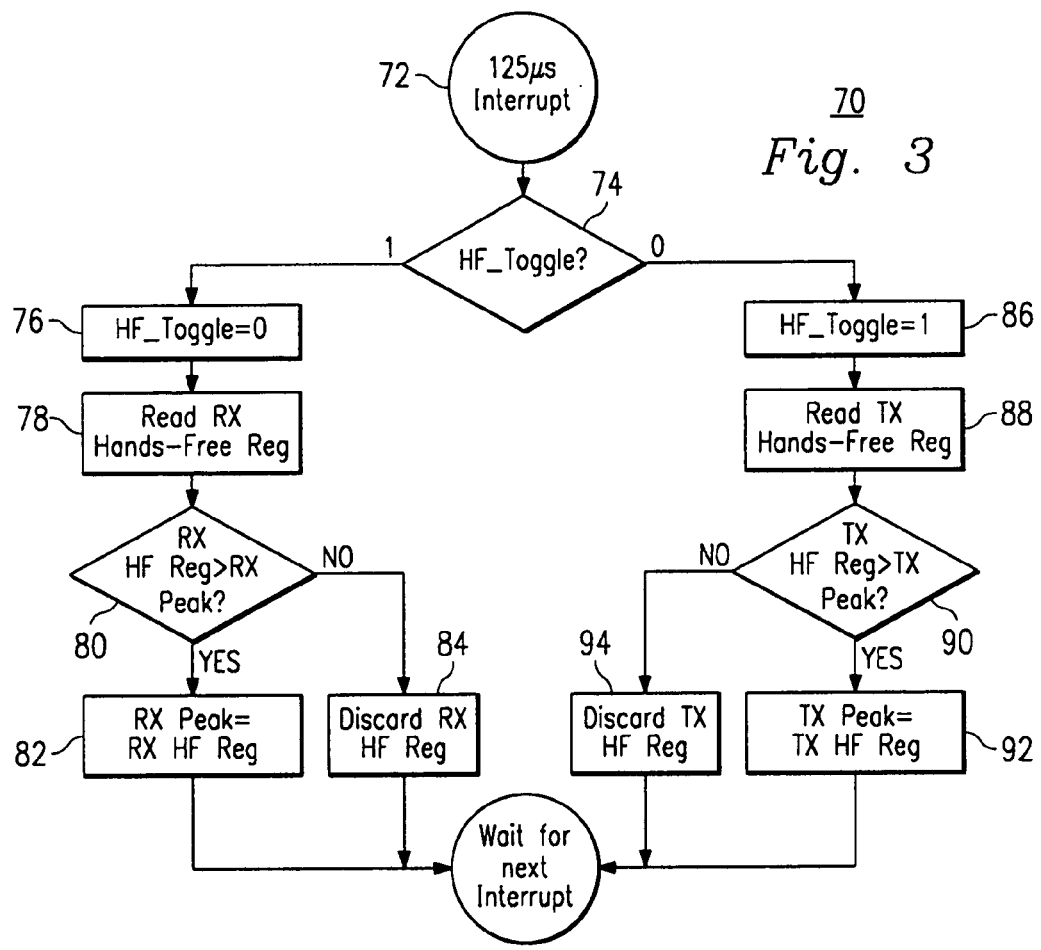
FIG. 3 is a flow chart of the algorithm for the peak detector 70 of the speakerphone algorithm.

Referring now to FIG. 3, as previously described, in step 72 the 125 $\mu$s frame variable generates the interrupts which cause the on-chip $\mu$P 38 to read one of the hands-free registers 34, 36 during the frame variable interrupt service routine. In step 74 a boolean flag HF_Toggle is used to keep track of which hands-free register to read during alternating passes. The hands-free register RX 34 is read during one pass, and the hands-free register TX 36 is read during the next, so the sample rate for both registers is 250 $\mu$s. If HF_Toggle=1 during an execution of the interrupt service routine, then in step 76 HF_Toggle is set equal to zero. In step 78 the $\mu$P 38 reads the hands-free register RX 34, and in step 80 compares the value to the saved (peak) value stored in the RAM variable RX_Peak. If the fresh value is greater than the saved value, then in step 82 the fresh value is stored in RX_Peak for future use. In step 84, the fresh value is discarded if it is less than or equal to the saved peak value. Likewise, if HF_Toggle=0 during an execution of the interrupt service routine, then in step 86 HF_Toggle is set equal to one. In step 88 the $\mu$P 38 reads the hands-free register TX 36, and in step 90 compares the value to the saved (peak) value stored in the RAM variable TX_Peak. If the fresh value is greater than the saved value, then in step 92 the fresh value is stored in TX_Peak for future use. In step 94 the fresh value is discarded if it is less than or equal to the saved peak value. The RX and TX peak values are accumulated in this way over the whole Peak Detection Window, which is 80 samples at 250 $\mu$s each, or 20 ms.

When the state machine 60 variable reaches 160 (20 ms), the Do_HF Boolean flag is set, and the $\mu$P 38 soon executes the hands-free state machine 60 which first copies the current values of RX_Peak and TX_Peak to separate RAM locations called RX_Max and TX_Max respectively (because RX_Peak and TX_Peak are continually updated by the frame variable interrupt service routine). These separate RAM locations are used for all subsequent volume level comparisons within the speakerphone algorithm 41.

Figure 4:
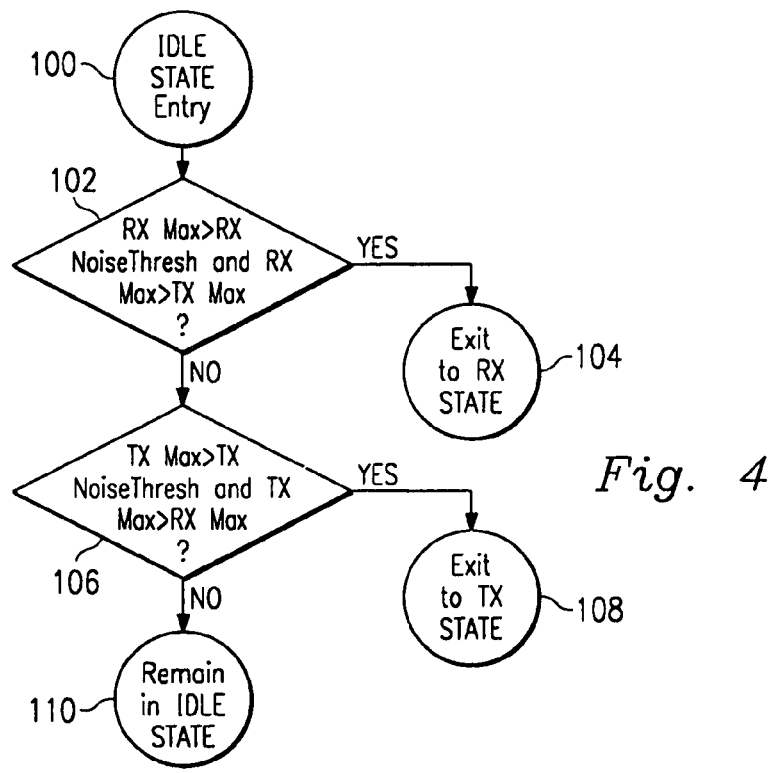
FIG. 4. is a flow chart of the algorithm for the idle state 68 of the speakerphone algorithm.

Referring now to FIG. 4, after the telephone call is made and the connection is established, the speakerphone in step 100 begins in the idle state 68 because both speech paths are quiet, because neither person has started talking yet. This "quiet level" is defined in software as a background noise level threshold, and an independent threshold is assigned for the speakerphone-side and the far-end environments. As shown in FIG. 2, and in the idle state 68 flow chart in FIG. 4, the state machine 60 decides during the current cycle whether to remain in the idle state 68, to enter the RX state 62, or the TX state 64, when the current cycle completes.

In step 102 the $\mu$P 38 checks to see if the volume level received from the far-end (RX_Max) rises above the pre-defined background noise level (RX_Noise_Thresh). If so, the speakerphone state machine 60 assumes the far-end person has just begun to speak. If this volume level is greater than the near-end volume level (TX_Max), then the speakerphone state machine 60 in step 104 will enter the RX state 62 when the current cycle completes. If both of these conditions are not met, then in step 106 the state machine 60 focuses on the TX speech path. If the near-end volume level (TX_Max) rises above the pre-defined background noise level (TX_Noise_Thresh), the speakerphone state machine 60 assumes the near-end person has just begun to speak. If this volume level is greater than the far-end volume level (RX_Max), then the speakerphone state machine 60 in step 108 will enter the TX state 64 when the current cycle completes. If both of these conditions are not met, then in step 110 the speakerphone state machine 60 remains in the idle state 68 until the next cycle, when the volume levels will be analyzed again.

Figure 5:
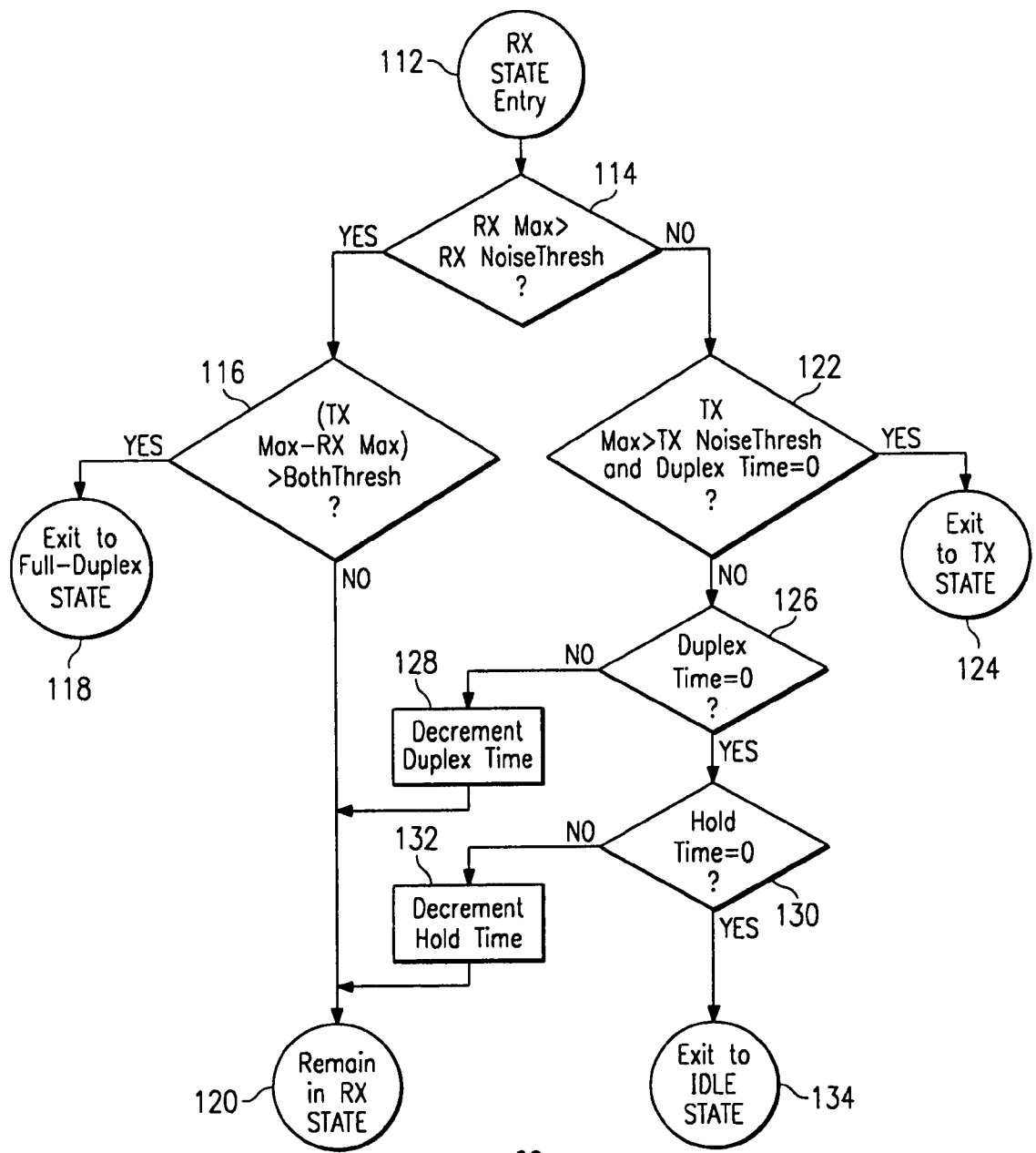
FIG. 5 is a flow chart of the algorithm for the RX state 62 of the speakerphone algorithm.

Referring now to FIG. 5, the RX state 62 is defined from the speakerphone's point of view as the state when the far-end person is talking but the person near the speakerphone is not talking. As shown in FIG. 2 and in FIG. 5, the state machine 60 decides during the current cycle whether to remain in the RX state 62, or to enter the TX state 64, the full-duplex state 66, or the idle state 68 when the current cycle completes.

Step 112 is the entry point for the RX state 62 algorithm. In step 114, if the volume level received from the far-end (RX_Max) is still greater than the pre-defined background noise level (RX_Noise_Thresh), the speakerphone state machine 60 assumes the far-end person is still speaking. Then in step 116, if the near-end volume level (TX_Max) exceeds the volume level received from the far-end (RX_Max) by a dynamic "both" level (Both_Thresh), the speakerphone state machine 60 assumes the near-end person has just begun to speak in addition to the far-end person, and in step 118 it will enter the full-duplex state when the current cycle completes. (Both_Thresh is detailed in a later section.) If the RX volume level exceeds the noise threshold, but insufficient TX volume is detected, then in step 120 the speakerphone state machine 60 remains in the RX state 62 until the next cycle, when the volume levels will be analyzed again.

If the RX volume level does not exceed the noise threshold, then in step 122 the state machine 60 focuses on the TX Speech Path. In step 122, if the TX volume level rises above the pre-defined background noise level (TX_Noise_Thresh), the speakerphone state machine 60 assumes the near-end person has just begun to speak and the far-end person has stopped. If the Duplex Variable has been decremented to 0, then in step 124 the speakerphone state machine 60 will enter the TX state 64 when the current cycle completes. If not, then in steps 126, 128 and 120 the duplex variable is decremented by 1 and the speakerphone state machine 60 remains in the RX state 62 until the next cycle. Thus the duplex variable imposes an 80 ms transition delay from the RX state 62 to the TX state 64. The state delays are implemented by executing multiple passes through the state machine.

The 80 ms delay from RX to TX state goes through the following steps:
step 112
step 114: no
step 122: no, TX_Max is greater, but Duplex_Time=4 (initial value)
step 126: no
step 128: Duplex_Time=3
step 120
(wait 20 ms, re-execute state machine)
step 112
step 114: no
step 122: no, TX_Max is greater, but Duplex_Time=3
step 126: no
step 128: Duplex_Time=2
step 120
(wait 20 ms, re-execute state machine)
step 112
step 114: no
step 122: no, TX_Max is greater, but Duplex_Time=2
step 126: no
step 128: Duplex_Time=1
step 120
(wait 20 ms, re-execute state machine)
step 112
step 114: no
step 122: no, TX_Max is greater, but Duplex_Time=1
step 126: no
step 128: Duplex_Time=0
step 120
(wait 20 ms, re-execute state machine)
step 112
step 114: no
step 122: yes, TX_Max is greater, Duplex_Time=0
step 124: exit to TX state If neither the RX volume nor the TX volume level exceeds their respective noise thresholds, the speakerphone state machine 60 delays a total of 240 ms (12 passes) before entering the idle state 68. This is accomplished in steps 126 to 134 by decrementing the duplex and hold variables during successive cycles of the speakerphone state machine 60.

Figure 6:
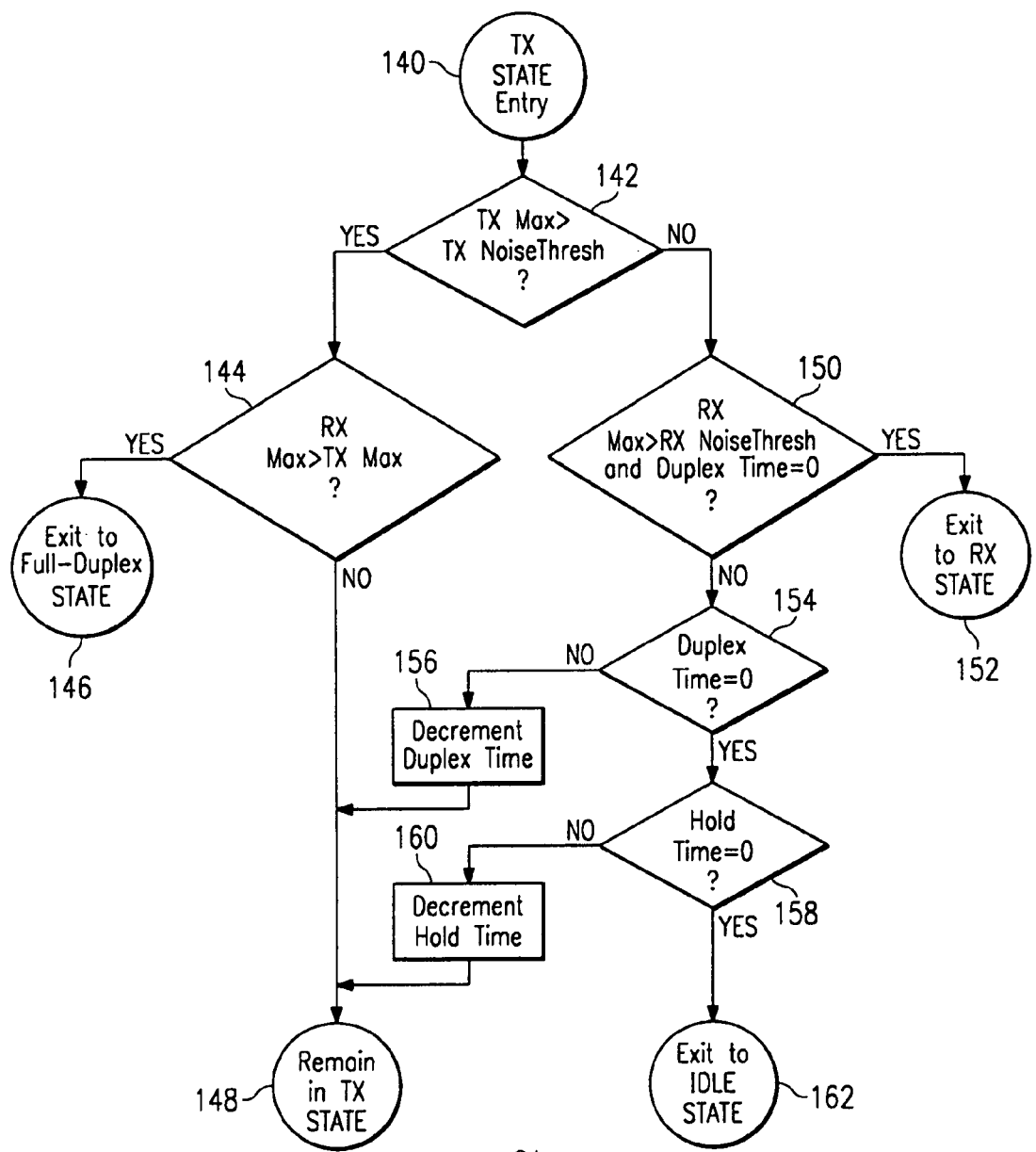
FIG. 6 is a flow chart of the algorithm for the TX state 64 of the speakerphone algorithm.

The 240 ms delay from RX to Idle state goes through the following steps:
step 112
step 114: no
step 122: no, TX_Max not greater, and Duplex_Time=4 (initial value)
step 126: no
step 128: Duplex_Time=3
step 120
(wait 20 ms, re-execute state machine)
step 112
step 114: no
step 122: no, TX_Max not greater, Duplex_Time=3
step 126: no
step 128: Duplex_Time=2
step 120
(wait 20 ms, re-execute state machine)
step 112
step 114: no
step 122: no, TX_Max not greater, Duplex_Time=2
step 126: no
step 128: Duplex_Time=1
step 120
(wait 20 ms, re-execute state machine)
step 112
step 114: no
step 122: no, TX_Max not greater, Duplex_Time=1
step 126: no
step 128: Duplex_Time=0
step 120
(wait 20 ms, re-execute state machine)
step 112
step 114: no
step 122: no, TX_Max not greater, Duplex_Time=0
step 126: yes
step 130: no, Hold_Time still=8 (initial value)
step 132: Hold_Time=7
step 120
(wait 20 ms, re-execute state machine)
step 112
step 114: no
step 122: no, TX_Max not greater, Duplex_Time=0
step 126: yes
step 130: no, Hold_Time=7
step 132: Hold_Time=6
step 120
(wait 20 ms, re-execute state machine)
step 112
step 114: no
step 122: no, TX_Max not greater, Duplex_Time=0
step 126: yes
step 130: no, Hold_Time=6
step 132: Hold_Time=5
step 120
(wait 20 ms, re-execute state machine)
step 112
step 114: no
step 122: no, TX_Max not greater, Duplex_Time=0
step 126: yes step 130: no, Hold_Time=5
step 132: Hold_Time=4
step 120
(wait 20 ms, re-execute state machine)
step 112
step 114: no
step 122: no, TX_Max not greater, Duplex_Time=0
step 126: yes
step 130: no, Hold_Time=4
step 132: Hold_Time=3
step 120
(wait 20 ms, re-execute state machine)
step 112
step 114: no
step 122: no, TX_Max not greater, Duplex_Time=0
step 126: yes
step 130: no, Hold_Time=3
step 132: Hold_Time=2
step 120
(wait 20 ms, re-execute state machine)
step 112
step 114: no
step 122: no, TX_Max not greater, Duplex_Time=0
step 126: yes
step 130: no, Hold_Time=2
step 132: Hold_Time=1
step 120
(wait 20 ms, re-execute state machine)
step 112
step 114: no
step 122: no, TX_Max not greater, Duplex_Time=0
step 126: yes
step 130: no, Hold_Time=1
step 132: Hold_Time=0
step 120
(wait 20 ms, re-execute state machine)
step 112
step 114: no
step 122: no, TX_Max not greater, Duplex_Time=0
step 126: yes
step 130: yes
step 134: exit to Idle State Referring now to FIG. 6, the TX state 64 is defined from the speakerphone's point of view as the state when the person near the speakerphone is talking but the far-end person is not talking. As shown in FIG. 2 and in FIG. 6, the state machine 60 decides during the current cycle whether to remain in the TX state 64, or to enter the RX state 62, the full-duplex state 66, or the idle state 68 when the current cycle completes.

Step 140 is the entry point for the TX state 64 algorithm. In step 142, if the near-end volume level (TX_Max) is still greater than the pre-defined background noise level (TX_Noise_Thresh), the speakerphone state machine 60 assumes the near-end person is still speaking. Then in step 144 if the volume level received from the far-end (RX_Max) exceeds the near-end volume level, the speakerphone state machine 60 assumes the far-end person has just begun to speak in addition to the near-end person, and in step 146 it will enter the Near Full-Duplex State when the current cycle completes. If the TX volume level exceeds the noise threshold but insufficient RX volume is detected, then in step 148 the speakerphone state machine 60 remains in the TX state 64 until the next cycle, when the volume levels will be analyzed again.

In step 142, if the TX volume level does not exceed the noise threshold, the state machine 60 focuses on the RX Speech Path. In step 150, If the RX volume level rises above the pre-defined background noise level (RX_Noise_Thresh), the speakerphone state machine 60 assumes the far-end person has just begun to speak and the near-end person has stopped. If the duplex variable has been decremented to 0, then in step 152 the speakerphone state machine 60 will enter the RX state 62 when the current cycle completes. If not, then in steps 154, 156, and 148 the duplex variable is decremented by 1 and the speakerphone state machine 60 remains in the TX state 64 until the next cycle. Thus the duplex variable imposes an 80 ms transition delay from the TX state 64 to the RX state 62.

The state delays are implemented by executing multiple passes through the state machine. The 80 ms delay from TX to RX state goes through the following steps:
step 140
step 142: no
step 150: no, RX_Max is greater, but Duplex_Time=4 (initial value)
step 154: no
step 156: Duplex_Time=3
step 148
(wait 20 ms, re-execute state machine)
step 140
step 142: no
step 150: no, RX_Max is greater, but Duplex_Time=3
step 154: no
step 156: Duplex_Time=2
step 148
(wait 20 ms, re-execute state machine)
step 140
step 142: no
step 150: no, RX_Max is greater, but Duplex_Time=2
step 154: no
step 156: Duplex_Time=1
step 148
(wait 20 ms, re-execute state machine)
step 140
step 142: no
step 150: no, RX_Max is greater, but Duplex_Time=1
step 154: no
step 156: Duplex_Time=0
step 148
(wait 20 ms, re-execute state machine)
step 140
step 142: no
step 150: yes, RX_Max is greater, Duplex_Time=0
step 152: exit to RX state If neither the TX volume nor the RX volume level exceeds their respective noise thresholds, the speakerphone state machine 60 delays a total of 240 ms (12 passes) before entering the Idle state 68. This is accomplished in steps 154 to 162 by decrementing the duplex and hold variables during successive cycles of the speakerphone state machine 60.

Figure 7:
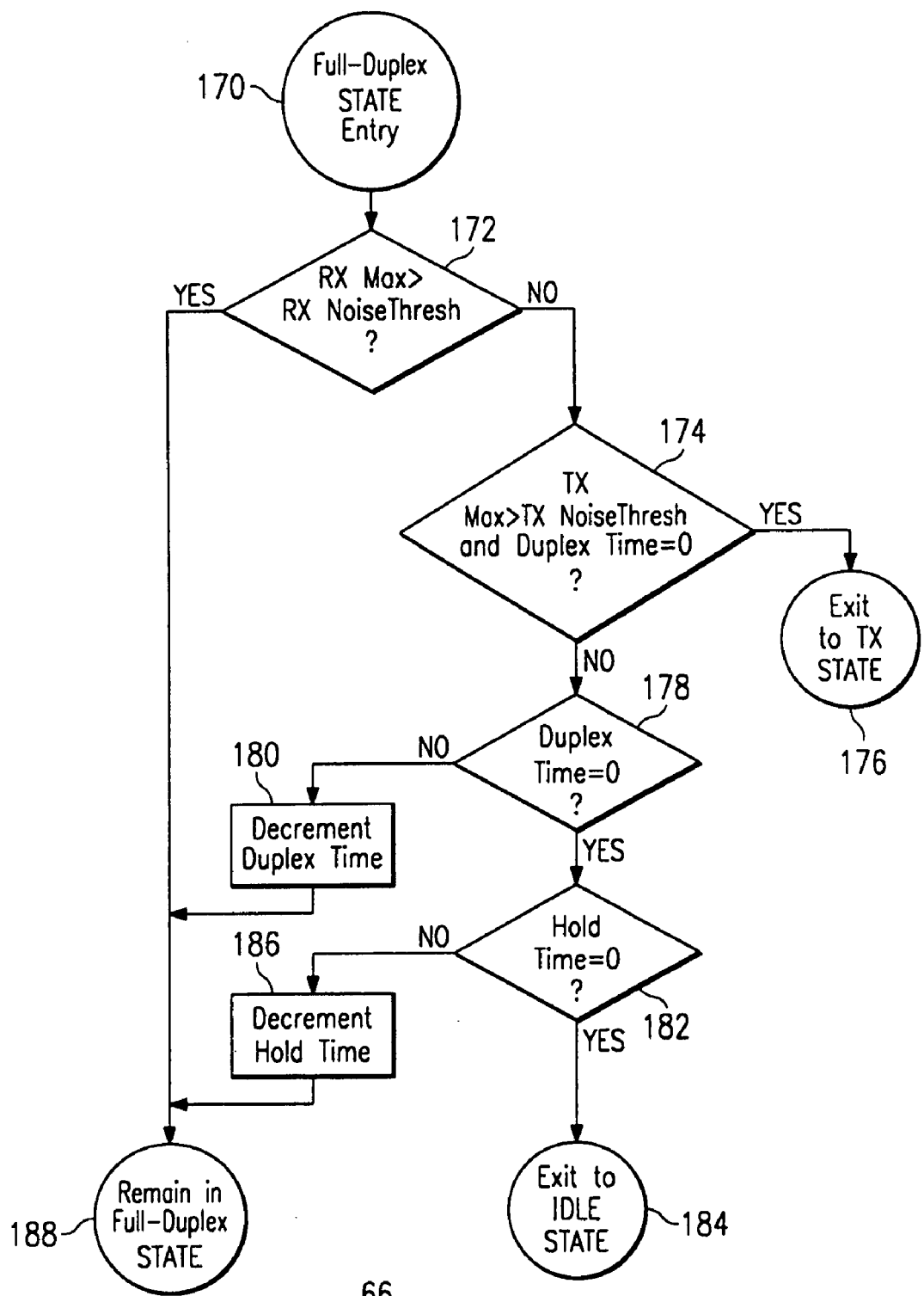
FIG. 7 is a flow chart of the algorithm for the full-duplex state 66 of the speakerphone algorithm.

Referring now to FIG. 7, the speakerphone state machine 60 enters the full-duplex state whenever both people are simultaneously talking. As shown in FIG. 2 and FIG. 7, the state machine 60 decides during the current cycle whether to remain in the Full-Duplex State, or to enter the TX or Idle state 68 when the current cycle completes. Once the speakerphone enters this state, it remains here until the far-end person stops talking, in which case the speakerphone returns to the Idle state 68. The reason for this is because it is much simpler in practice to detect that the far-end person has stopped talking than to detect that the near-end person has stopped talking, due to the acoustic coupling of the speakerphone's speaker to its microphone.

Step 170 is the entry point for the full-duplex state 66 algorithm. In step 172, if the volume level received from the far-end (RX_Max) is still greater than the pre-defined background noise level (RX_Noise_Thresh), the speakerphone state machine 60 assumes the far-end person is still speaking, and therefore remains in the full-duplex state 66 until the next cycle, when the volume levels will be analyzed again.

In step 172, if the RX volume level does not exceed the noise threshold, the state machine 60 focuses on the TX Speech Path. In step 174, if the TX volume level is still greater than the pre-defined background noise level (TX_Noise_Thresh), the speakerphone state machine 60 assumes the near-end person is still speaking but the far-end person has stopped. If the duplex variable has been decremented to 0, then in step 176 the speakerphone state machine 60 will enter the TX state 64 when the current cycle completes. If not, in step 180 the duplex variable is decremented by 1, and the speakerphone state machine 60 remains in the full-duplex state 66 until the next cycle. Thus the duplex variable imposes an 80 ms transition delay from the full-duplex state to the TX state 64.

The state delays are implemented by executing multiple passes through the state machine. The 80 ms delay from Full-Duplex state to TX state goes through the following steps:

step 170
step 172: no
step 174: no, TX_Max is greater, but Duplex_Time=4 (initial value)
step 178: no
step 180: Duplex_Time=3
step 188
(wait 20 ms, re-execute state machine)
step 170
step 172: no
step 174: no, TX_Max is greater, but Duplex_Time=3
step 178: no
step 180: Duplex_Time=2
step 188
(wait 20 ms, re-execute state machine)
step 170
step 172: no
step 174: no, TX_Max is greater, but Duplex_Time=2
step 178: no
step 180: Duplex_Time=1
step 188
(wait 20 ms, re-execute state machine)
step 170
step 172: no
step 174: no, TX_Max is greater, but Duplex_Time=1
step 178: no
step 180: Duplex_Time=0
step 188
(wait 20 ms, re-execute state machine)
step 170
step 172: no
step 174: yes, TX_Max is greater, Duplex_Time=0
step 176: exit to TX state If neither the RX volume nor the TX volume level exceeds their respective noise thresholds, the speakerphone state machine 60 delays a total of 240 ms (12 passes) before entering the idle state 68. This is accomplished in steps 178 to 184 by decrementing the duplex and hold variables during successive cycles of the speakerphone state machine 60.

The final task of the speakerphone algorithm 41 is the digital adjustment of the microphone and speaker gains as directed by the speakerphone state machine 60. The inputs to a gain adjustment routine 230 are the volume levels in the RX and TX speech paths (RX_Max and TX_Max) and the current state. The portable handset 16 implements fixed gain settings in the idle state 68 and in the TX state 64, but Automatic Gain Control (AGC) is implemented in software in the RX state 62 and in the full-duplex state 66. In all cases, the gain adjustment routine 230 selects the optimum gain settings for the present volume levels, based on a pre-defined correspondence of volume levels and gain settings, i.e.: for any given combination of RX and TX volume levels, the optimum gain setting was experimentally determined during the development of the wireless speakerphone system 10. Thus there is no guesswork or adapting process in the gain adjustment routine 230; it simply outputs one gain setting for the current volume inputs it receives during each time it is executed.

The same inputs (RX_Max and TX_Max) are given to the speakerphone state machine 60 as to the gain adjustment routine 230. These inputs are copied from RX_Peak and TX_Peak prior to the execution of the speakerphone state machine 60, and thus remain constant long after the end of the gain adjustment routine 230. In addition, a routine RX AGC 231 requires the RX volume level to be quantified into several volume ranges, so this quantification is done by the RX quantification routine 190, just after RX_Max and TX_Max are updated, and just before the speakerphone state machine 60 begins.

All gain adjustments are accomplished simply by writing a gain coefficient value to the appropriate gain control register inside the controller chip 14. There are three such registers used by the speakerphone algorithm 41: the RX attenuation register 52; the TX attenuation register 54; and the microphone pre-amplification register 46.

Figure 9A:
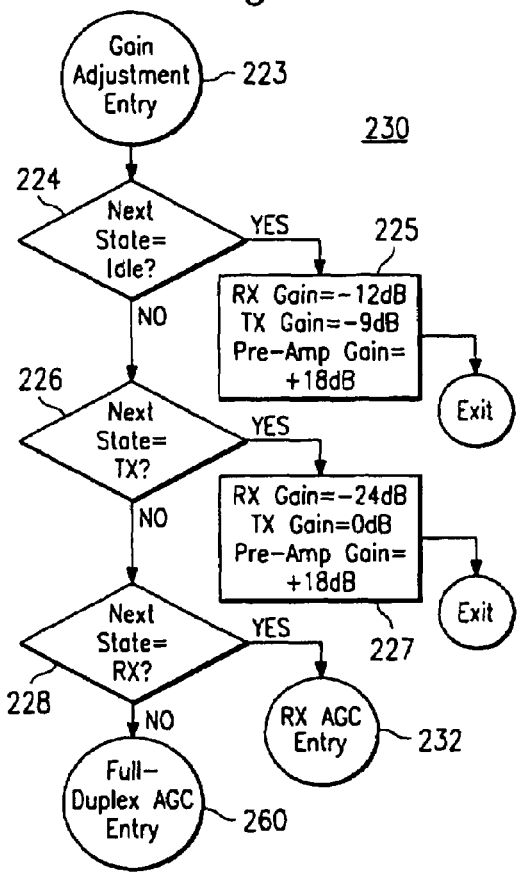
FIG. 9a is a flow chart of the RX gain adjustment routine 230 of the speakerphone algorithm.
Figure 9B:
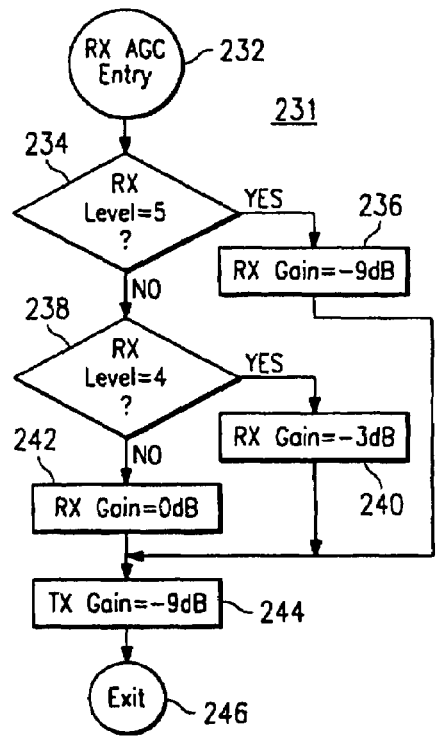
FIG. 9b is a flow chart of the RX AGC 231 of the speakerphone algorithm.

Referring now to FIG. 9a, the gain adjustment routine 230, entered at step 223, does only one of four possible things, depending on the next speakerphone state:

a) If the speakerphone state machine 60 just decided in step 224 that the next state to be entered is the idle state 68, then in step 225 the gain adjustment routine 230 sets pre-determined speaker and microphone gains by simply writing the appropriate gain coefficient value to the gain control registers.

b) If the speakerphone state machine 60 just decided in step 226 that the next state to be entered is the TX state 64, then in step 227 the gain adjustment routine 230 sets pre-determined speaker and microphone gains by simply writing the appropriate gain coefficient value to the gain control registers.

c) If the speakerphone state machine 60 decides in step 228 that the next state to be entered is the RX state 62, then in step 232 the gain adjustment routine 230 executes the RX AGC 231 (shown in FIG. 9b). (Note that the RX quantization routine 190 has already been executed by this time). The RX quantification routine 190 stored the result of its RX volume comparisons in the RAM variable RX_Level, for later use by the RX AGC 231. The RX AGC 231 uses the output of the RX quantification routine 190 (RX_Level) in order to decide the optimal gain coefficients to be written to the gain control registers.

d) If in step 228 the speakerphone state machine 60 just decided that the next state to be entered is the full-duplex state 66, the gain adjustment routine 230 executes the full-duplex AGC routine, entered at step 260. The full-duplex AGC routine is shown in FIG. 11.

Figure 11:
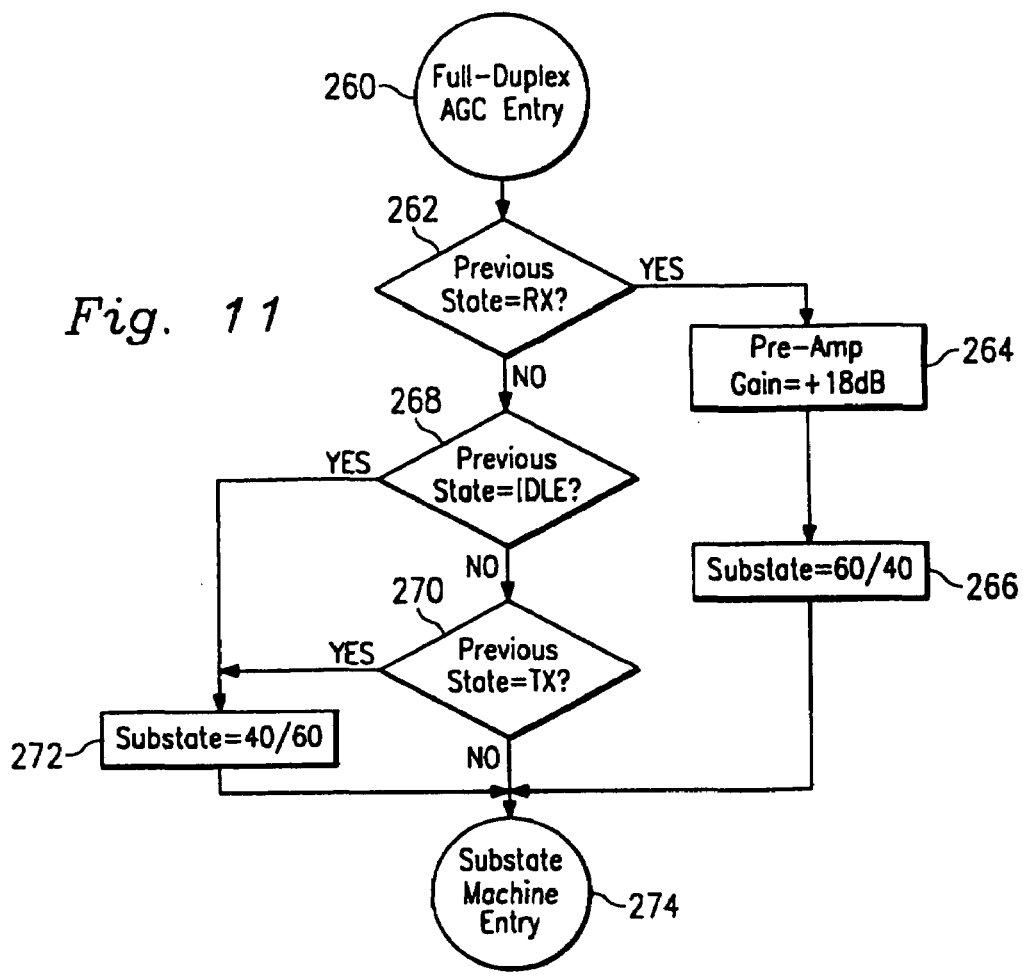
FIG. 11 is a flow chart of the full-duplex substate initialization routine of the speakerphone algorithm.
Figure 13A:
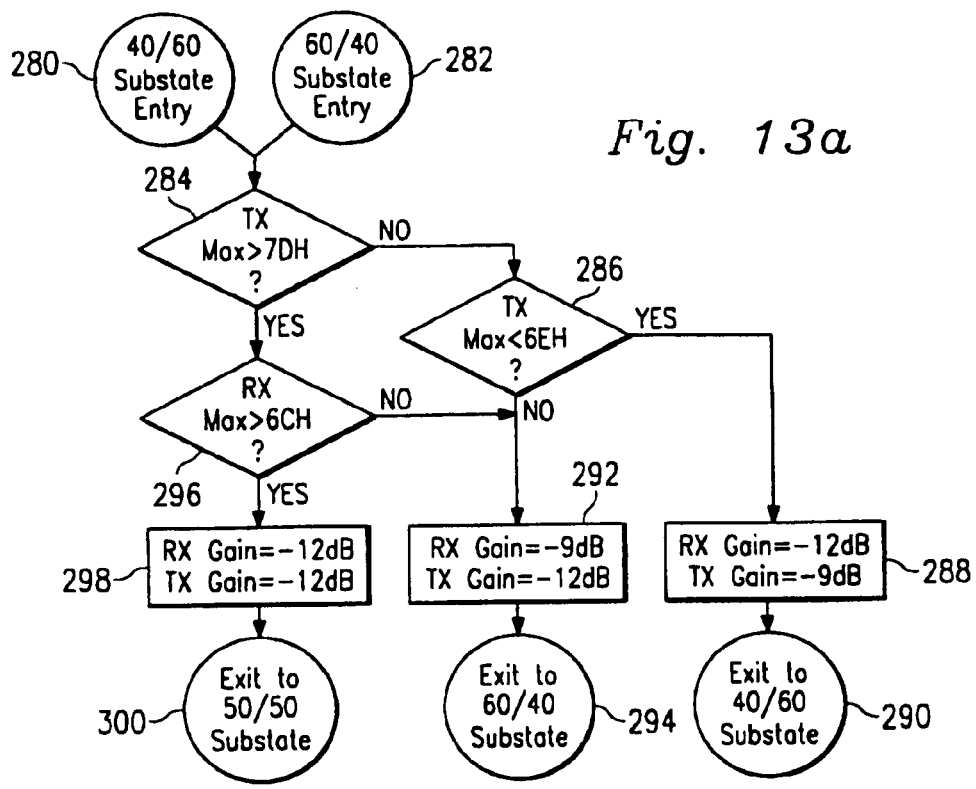
FIGS. 13a and 13b are flow charts of the routine by which the mapping of FIG. 12 is determined.
Figure 13B:
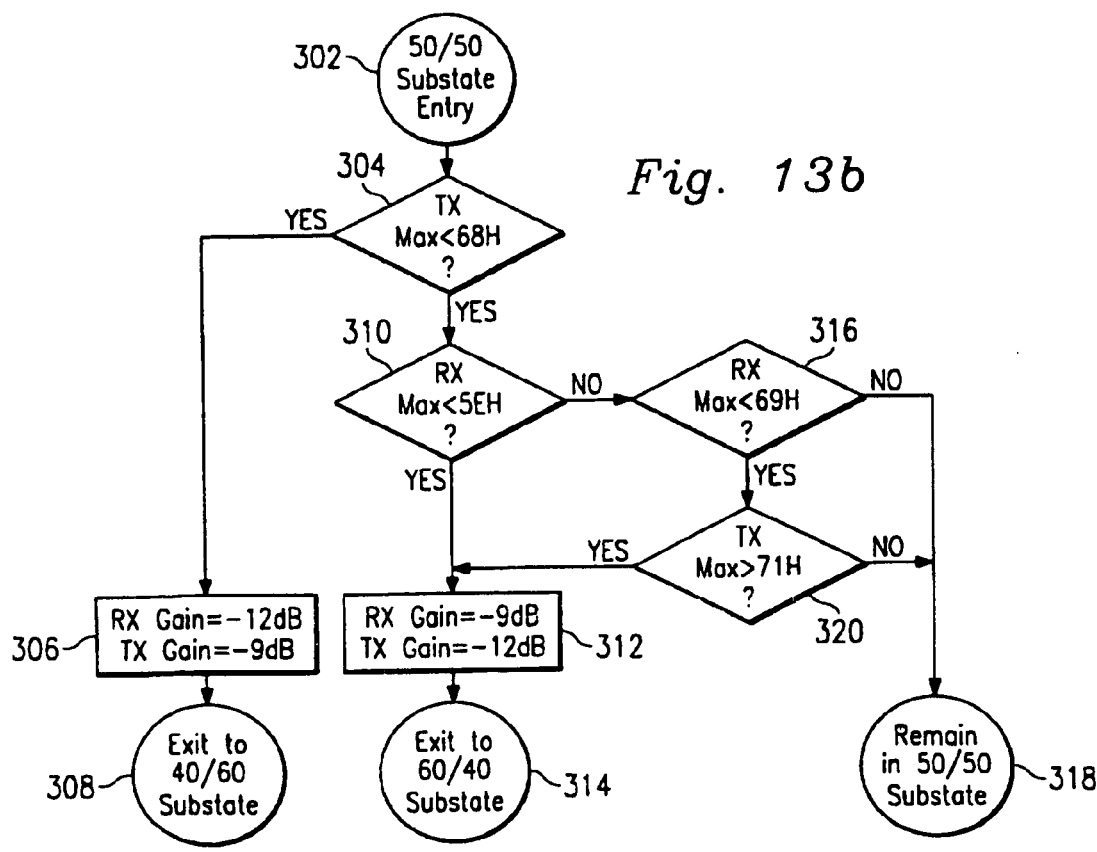

Step 274 in FIG. 11 causes immediate execution of the three AGC substates shown in FIGS. 13a and 13b:
1) if the substate=40/60, execution begins at step 280 in FIG. 13a; or
2) if the substate=60/40, execution begins at step 282 in FIG. 13a; or
3) if the substate=50/50, execution begins at step 302 in FIG. 13b.

When the idle state 68 is entered, the gain adjustment routine 230 sets the RX gain to −12 dB, sets the TX gain to −9 dB, and sets the Pre-Amp gain to +18 dB. These gain settings are accomplished when the µP 38 writes the following coefficients to the gain control registers:

| Gain Control Register | Value Written | Gain Setting |
| --- | --- | --- |
| RX Attenuation 52 | $20_H$ | −12 dB |
| TX Attenuation 54 | $2D_H$ | −9 dB |
| Mic. Pre-Amp. 46 | $90_H$ | +18 dB |

In the RX state 62, which is a half-duplex state, the speaker gain is controlled in software by Automatic Gain Control (AGC), and the microphone gain is significantly reduced. Here, the AGC keeps the RX volume level as loud as possible within the practical constraints imposed by the portable handset 16.

Figure 8:
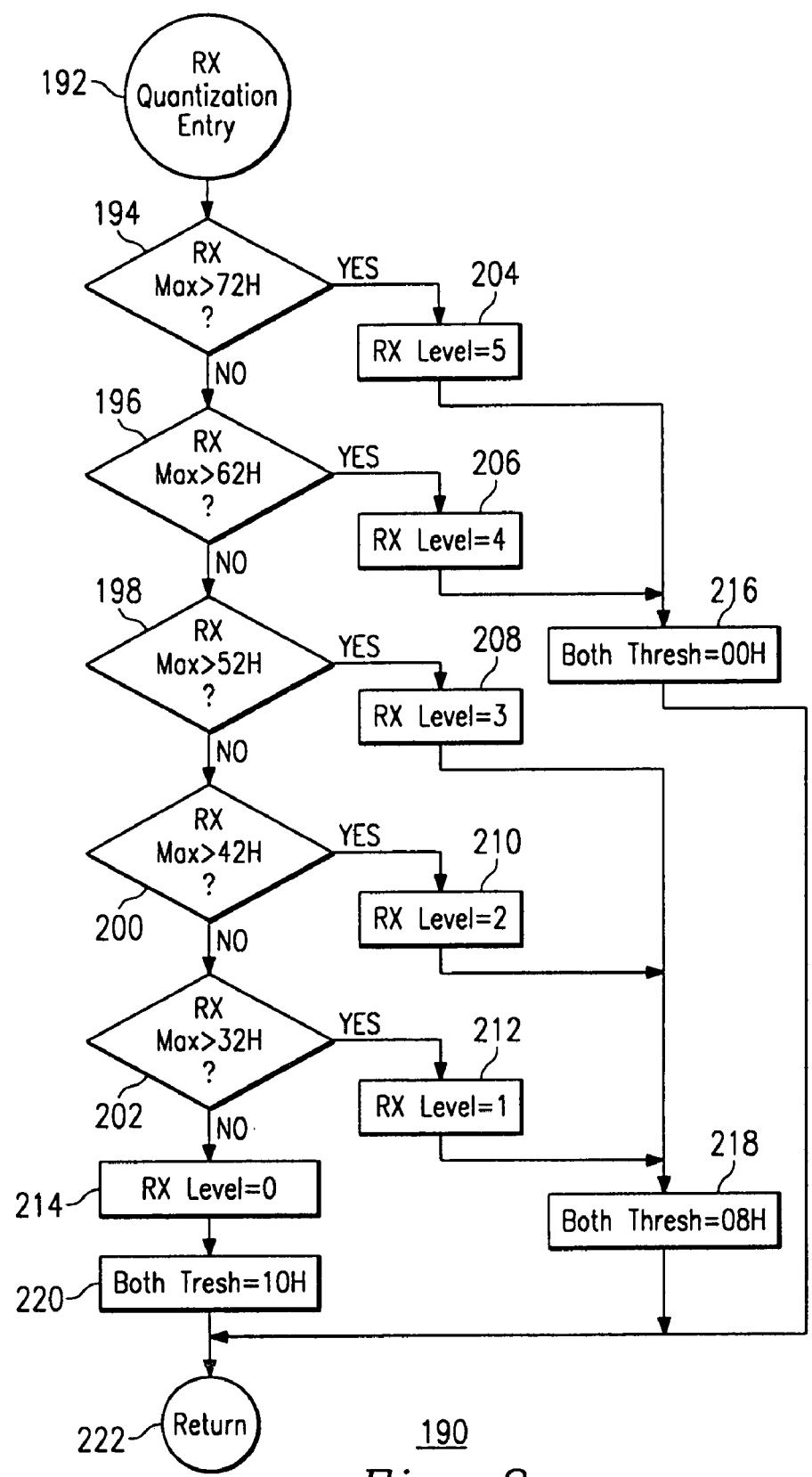
FIG. 8 is a flow chart of the RX quantification routine 190 of the speakerphone algorithm.

Referring now to FIG. 8, the purpose of an RX quantification routine 190 is to quantify the RX volume level into one of six volume ranges, and to pass this information to the gain adjustment routine 230 for use by the RX AGC 231. This quantification is accomplished by comparing the RX volume level (RX_Max) to pre-defined volume levels (steps 194 to 202), and storing the result in the RAM variable RX_Level, as shown below. RX_Max has a maximum range of $00_H$ to $7F_H$.

| RX_Max Volume Range | Value stored in RX_Level | Step |
| --- | --- | --- |
| $73_H$ to $7F_H$ | 5 | 204 |
| $63_H$ to $72_H$ | 4 | 206 |
| $53_H$ to $62_H$ | 3 | 208 |
| $43_H$ to $52_H$ | 2 | 210 |
| $33_H$ to $42_H$ | 1 | 212 |
| $00_H$ to $32_H$ | 0 | 214 |

The RX quantification routine 190 also adjusts the value of Both_Thresh according to the RX volume level, in steps 216, 218, and 220. Both_Thresh represents the amount of energy that the TX volume must exceed the RX volume in order to exit the RX state 62 and enter the full-duplex state 66, i.e., how loud the near-end person must speak in order for the speakerphone algorithm 41 to recognize that both people are simultaneously speaking. The reason why Both_Thresh is dynamic rather than a fixed value is directly related to the RX AGC 231. At low RX volume levels, the RX AGC 231 will boost the RX signal as much as possible to allow the near-end person to hear better. Due to acoustic coupling, this amplification results in a strong signal at the microphone, so some means is needed to prevent the speakerphone algorithm 41 from misinterpreting this strong microphone signal as near-end speech. Conversely, at high RX volume levels, the RX AGC 231 does not need to add much amplification in order for the signal to be heard well. In this case it would be undesirable to require the near-end person to shout at the speakerphone in order to enter the full-duplex state 66, so some reasonable means is need to allow this state transition to occur. Therefore Both_Thresh is implemented to create a "cushion" of volume to determine when the near-end person is speaking simultaneously with the far-end person. At low RX volume levels, Both_Thresh is large enough to mask acoustic coupling, and at high RX volume levels, Both_Thresh is small enough to allow a reasonable TX volume to cause the transition to the full-duplex state 66.

Referring now to FIG. 9b, when the gain adjustment routine 230 is executed, the RX AGC 231 dramatically reduces the TX Speech Path gain by setting the Pre-Amp gain to +3 dB, sets the TX gain to −9 dB, and controls the RX gain in software by the AGC. The RX quantification routine 190 has already updated RX_Level with the volume range of RX_Max, so the AGC is simply a matter of selecting higher gain for weak RX signals and lower gain for strong RX signals, as shown below.

| Gain Control Register | Value Written | Gain Setting |
| --- | --- | --- |
| Mic. Pre-Amp. 46 | $80_H$ | +3 dB |
| TX Attenuation 54 | $2D_H$ | −9 dB |

Referring again to FIG. 9b, the steps of the RX AGC 231 are shown below in the far right column.

| RX_Level | Gain Control Register | Value Written | Gain Setting | Steps |
| --- | --- | --- | --- | --- |
| 0, 1, 2, 3 | RX Attenuation 52 | $7F_H$ | 0 dB | 234, 238, 242 |
| 4 | RX Attenuation 52 | $5B_H$ | −3 dB | 234, 238, 240 |
| 5 | RX Attenuation 52 | $2D_H$ | −9 dB | 234, 236 |

Due to the particular microphone 42 (Tram Model No. TR-50, manufactured by Tram Electronics, Inc., Cookstown, N.J. 08511) used in the portable handset 16, the external amplifier 48, and the physical location in the portable handset 16, it is not necessary to graduate the TX volume level into ranges by a TX quantification routine. The center of the microphone (⅜" diameter) is 6⅛" inches from the center of the speaker (2" diameter). Both components are oriented facing the same direction (up, when the speakerphone is placed flat on a desktop). Here, the "acceptable" background noise level limits the maximum microphone gain applied, with the result that a single digital gain setting is sufficient for the entire range of TX volume levels.

When the TX state 64 is entered, the gain adjustment routine 230 reduces the RX gain to −24 dB, boosts the TX gain to 0 dB, and sets the Pre-Amp gain to +18 dB. These gain settings are accomplished when the µP 38 writes the following coefficients to the gain control registers.

| Gain Control Register | Value Written | Gain Setting |
| --- | --- | --- |
| RX Attenuation 52 | $08_H$ | −24 dB |
| TX Attenuation 54 | $7F_H$ | 0 dB |
| Mic. Pre-Amp. 46 | $90_H$ | +18 dB |

In the Full-Duplex State, software Automatic Gain Control (AGC) regulates the gain proportions of the microphone and speaker amplifiers 54, 52 to keep the volume high in both speech paths without producing unstable audio feedback. By constantly monitoring the volume levels in the speech paths (as reflected in RX_Max and TX_Max), and by constantly adjusting the amplifier gains accordingly, the AGC dynamically regulates the balance of the two speech paths to allow both people to speak and hear simultaneously.

Figure 10:
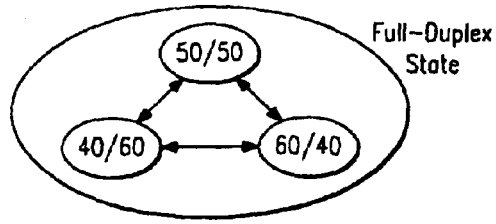
FIG. 10 is a state diagram and table showing the substates within the full-duplex state 66.

Referring now to FIG. 10, the full-duplex AGC is implemented as three substates within the full-duplex state 66, where each substate corresponds to a different gain combination. These substates are named "40/60", "50/50" and "60/40" to reflect the percentage ratio of RX-to-TX gain. The 40/60 substate's gain setting emphasizes the microphone (for weak near-end speech), the 50/50 Substate's gain setting handles the case when strong volumes are present in both speech paths, and the 60/40 Substate's gain setting emphasizes the speaker (for weak far-end speech). The same pre-amp gain is programmed for each of the substates within the full-duplex state 66.

Referring now to FIG. 11, during each execution pass of the speakerphone state machine 60, if the full-duplex state 66 is entered, in step 260, only one of the three AGC substates is entered. In step 262, if the previous state was the RX state 62, then in step 264 the pre-amp gain is boosted to +18 dB, and then in step 266 the substate is initialized to the 60/40 substate. In step 268, if the previous state was the idle state 68, or in step 270, if the previous state was the TX state 64, then in step 272 the substate is initialized to the 40/60 substate. If the previous state was the full-duplex state 66, then in step 274 the substate is unchanged to retain the previous AGC substate.

Figure 12:
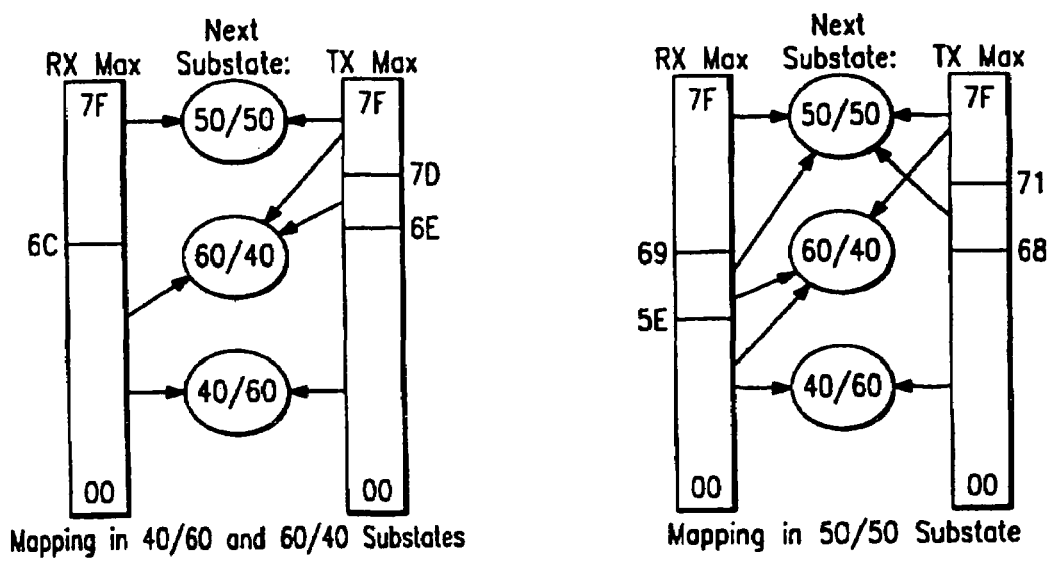
FIG. 12 is a diagram showing the mapping of the RX and TX volume levels.

During the current cycle, a substate machine decides which one of the three substates will be entered when the current cycle completes. This decision is based on the RX and TX volume levels (RX_Max and TX_Max), and on the current substate. The substate machine compares RX_Max and TX_Max to pre-defined value ranges to determine the optimal gains settings for the present volume levels. These value ranges were experimentally determined during the development of the wireless speakerphone system 10, and resulted in the creation of a mapping of RX and TX volume levels to optimal gain settings. The mapping for the wireless speakerphone system 10 is shown in FIG. 12. The key to the stability of the AGC is to include hysteresis in the range boundaries, to avoid the metastable condition of the AGC oscillating between two substates in successive execution passes of the speakerphone state machine 60. The mapping shown in FIG. 12 for the wireless speakerphone system 10 includes this type of hysteresis. Two examples are given next to explain how hysteresis is implemented.

EXAMPLE 1

In the 40/60 and 60/40 substates, TX_Max must: rise above $7D_H$ and RX_Max must rise above $6C_H$ in order to cause a substate transition to the 50/50 substate. The AGC remains in the 50/50 substate until TX_Max falls below $71_H$ and until RX_Max falls below $69_H$, thus allowing $0C_H$ of TX hysteresis and $03_H$ of RX hysteresis between the 50/50 substate and the 40/60, 60/40 substates.

EXAMPLE 2

Because the 40/60 and 60/40 substates share the same mapping, it may appear at first that there is no hysteresis between these two substates. However, an understanding of the speakerphone system explains the hysteresis. Increasing the RX gain increases the value of TX_Max due to acoustic coupling of the speaker to the microphone, which results in an apparent increase in TX speech volume from the point of view of the μP 38. In the 40/60 substate the RX gain is 40% of the combined RX and TX gains. If the transmit speech gets loud enough to cause TX_Max to rise above $6E_H$, the AGC initiates a substate transition to the 60/40 substate, and thus decreases the TX gain in order to compensate for the apparent increased TX speech volume. The transition also increases the RX gain from 40% to 60%, which from the point of view of the μP 38, increases the apparent TX volume as indicated by TX_Max. In the portable handset 16, this increase is generally $03_H$ to $04_H$, which means TX_Max is now $71_H$ to $72_H$. The AGC remains in this 60/40 substate until TX_Max falls back below $6E_H$, thus allowing more than $03_H$ of hysteresis between the 40/60 and 60/40 substates.

Thus by determining which range the RX and TX volume levels fall into, the AGC decides which next substate (and consequently which pre-defined gain setting) is best for the associated input volume levels.

Figure 14:
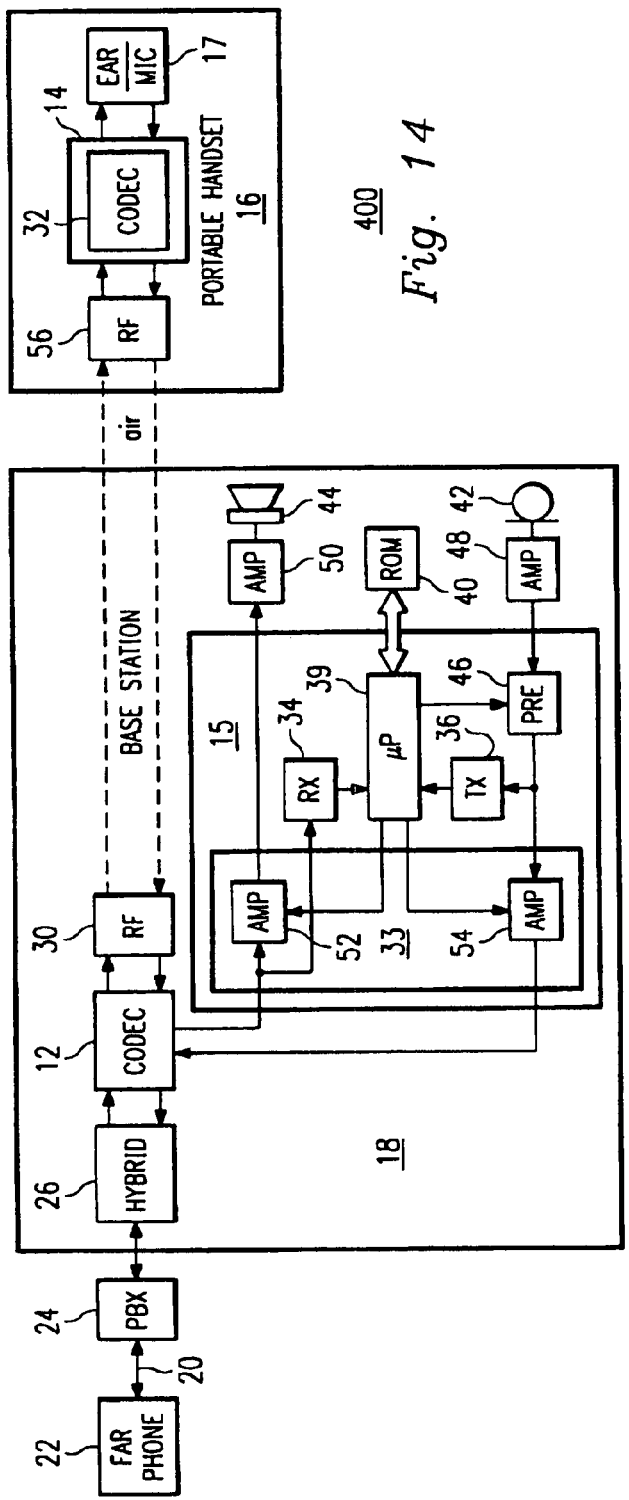
FIG. 14 is block diagram of a first alternate embodiment, having the speakerphone in the base station.

FIGS. 13 and 14 show the decision process which implements the mapping of RX and TX volume levels to optimal gain settings, and defines the next substate. Referring now to FIG. 13a, the μP 38 begins at either step 280 or step 282, depending on the substate decided by the full-duplex AGC in FIG. 11. In step 284, the AGC determines if TX_Max is greater than $7D_H$. If it is not, then in step 286 the AGC determines if TX_Max is less than $6E_H$. If it is, then in step 288 the RX gain is set equal to −12 dB, and the TX gain is set equal to −9 dB. In step 290, the substate machine will enter the 40/60 substate when the current cycle completes. In step 286, if TX_Max is not less than $6E_H$, then in step 292 the RX gain is set equal to −9 dB, and the TX gain is set equal to −12 dB. In step 294, the substate machine will enter the 60/40 substate when the current cycle completes. Referring back to step 284, if TX_Max is greater than $7D_H$, then in step 296 the AGC determines if RX_Max is greater than $6C_H$. If it is not, then in step 292 the RX gain is set equal to −9 dB, and the TX gain is set equal to −12 dB. In step 294, the substate machine will enter the 60/40 substate when the current cycle completes. Referring back to step 296, if RX_Max is greater than than $6C_H$, then in step 298 the RX gain is set equal to −12 dB, and the TX gain is set equal to −12 dB. In step 300, the substate machine will enter the 50/50 substate when the current cycle completes.

Referring now to FIG. 13b, in step 302 the μP 38 begins at step 302 if the substate decided by the full-duplex AGC in FIG. 11 is the 50/50 substate. In step 304, the AGC determines if TX_Max is less than 68H. If it is, then in step 306 the RX gain is set equal to −12 dB, and the TX gain is set equal to −9 dB. In step 308, the substate machine will enter the 40/60 substate when the current cycle completes. Referring back to step 304, if TX_Max is not less than 68H, then in step 310 the AGC determines if RX_Max is less than $5E_H$. If it is, then in step 312 the RX gain is set equal to −9 dB, and the TX gain is set equal to −12 dB. In step 314, the substate machine will enter the 60/40 substate when the current cycle completes. Referring back to step 310, if RX_Max is not less than $5E_H$, then in step 316 the AGC determines if RX_Max is less than 69H. In step 318, the substate machine remains in the 50/50 substate until the next cycle. If RX_Max is less than 69H, then in step 320 the AGC determines if TX_Max is greater than 71H. If it is, then in step 318, the substate machine remains in the 50/50 substate until the next cycle. If it is not, then in step 312, the RX gain is set equal to −9 dB, and the TX gain is set equal to −12 dB. In step 314, the substate machine will enter the 60/40 substate when the current cycle completes.

In addition to the preferred embodiment of a speakerphone in the portable handset 16, the same speakerphone algorithm 41 can be implemented in at least two other embodiments. In typical speakerphone configurations available on the market today, the half-duplex speakerphone function is implemented in the base station 18 rather than in the portable handset 16. Referring now to FIG. 14, in a first alternate embodiment of the invention, a wireless speakerphone system 400 has a second codec 33 in the base station 18. The same full-duplex speakerphone algorithm 41 can be executed by the base station's $\mu P$ 39. In the alternate embodiment of FIG. 14, the two hardware requirements are maintained:

the RX and TX volume levels are provided to the $\mu P$ 39 in digital form; and the $\mu P$ 39 can control the gain in the RX and TX speech paths.

The portable handset 16 also includes a typical earphone/microphone 17.

To further generalize, the same full-duplex speakerphone algorithm 41 can be executed by the $\mu P$ 38 in any telephone system where the following two hardware requirements are maintained:

the RX and TX volume levels are provided to the $\mu P$ 38 in digital form; and the $\mu P$ 38 can control the gain in the RX and TX Speech paths.

Figure 15:
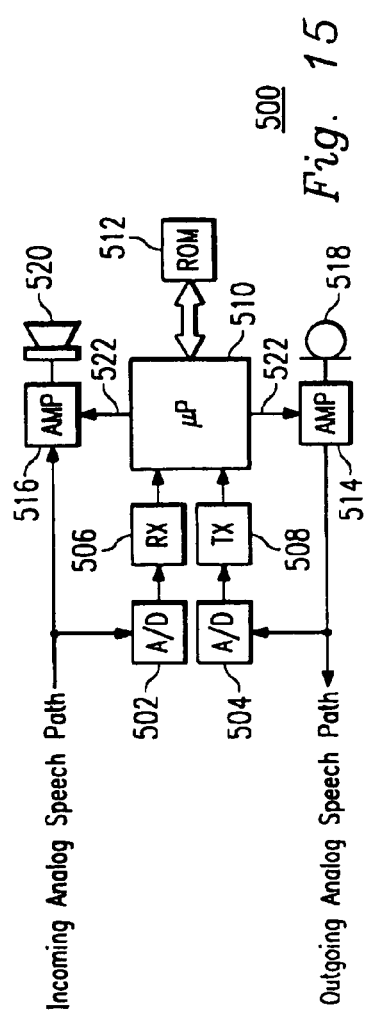
FIG. 15 is block diagram of a second alternate embodiment.

FIG. 15 shows such a second alternate embodiment of the invention. A wireless speakerphone system 500 includes analog-to-digital converters 502 and 504. The converter 502 sends a digital voice signal to a receive speech register 506, which has an 8 kHz sample rate. The converter 504 sends a digital voice signal to a transmit speech register 508, which also has an 8 kHz sample rate. A microprocessor $\mu P$ 510 controls the functioning of the system 500, under the direction of the speakerphone algorithm 41 stored in a ROM 512. Amplifiers 514 and 516 amplify the voice signals from a microphone 518, and to a speaker 520. The amplifiers 514, 516 can be analog or digital as long as their gain is selectable by means of a $\mu P$ data bus 522.

The present invention has many advantages over the prior art. It provides better sound quality than the typical half-duplex speakerphone. It allows a full-duplex conversation, i.e.: simultaneous speaking and hearing.

The present invention eliminates the need for an external analog speakerphone chip and a DSP engine, and instead performs the comparisons, decisions, and gain adjustments by a small on-chip $\mu P$ 38. The on-chip hands-free registers 34, 36 eliminate the need for a costly external speakerphone chip to implement the analog volume comparisons and make the speaker/microphone gain decisions.

Software-programmable digital gains are provided on-chip, thus eliminating the need for expensive external analog decoders with resistor ladders. The user-controlled volume setting is typically implemented in hardware in an analog speakerphone via a potentiometer, but suffers from degraded audio quality over time due to dust in the potentiometer mechanism and DC offset drift. The speakerphone handles volume control via software.

The present invention eliminates the need for a second codec in the base station (one codec is needed for the analog interface to the telephone line, and the second codec would be needed to handle the analog speakerphone interface). In the present invention, the second codec is provided in the portable handset 16 where it was already needed to complete the digital wireless voice connection.

The user enjoys the obvious freedom of wires to the speakerphone enclosure, for example, when the wireless speakerphone is used in a large conference room, and when the same speakerphone is used in one of several different conference rooms.

Multiple variations and modifications are possible in the embodiments of the invention described here. Although certain illustrative embodiments of the invention have been shown and described here, a wide range of modifications, changes, and substitutions is contemplated in the foregoing disclosure. In some instances, some features of the present invention may be employed without a corresponding use of the other features. For example, the algorithm 41 performs reasonably well if the following times are used:

1. 125 $\mu s$ Timer increased to 1 ms or 2 ms
2. 20 ms Timer increased to 80 ms
3. 160 ms Hold Time+80 ms Duplex Time increased up to about 1 second
4. Peak Detection Window reduced from 80 samples to 40 samples It is possible to decrease rather than increase these times and achieve the same performance, but it would result in a higher power consumption in the portable handset 16, and therefore would reduce the user's maximum "talk time", because it would drain the battery faster. On the other hand, if one increases the timing, he would thus be increasing the "talk time" by reducing the portable handset's power consumption.

A slight change in the speakerphone algorithm 41 will allow the user to adjust the "background noise level thresholds" slightly, rather than having them fixed as they are in the preferred embodiment. For example, the background noise level is "pre-defined" for a typical quiet engineering office. On the other hand, for a typical noisy office at a stock brokerage, the user can press a near-end noise button on the handset 16 (not shown) a few times to adjust this background noise level (in small steps) for the cases when the noise level around him is higher. Likewise, if he hears that the noise level from the far-end is high, he can press a far-end noise button on the handset 16 (not shown) a few times to adjust the far-end background noise level threshold. The result is that the speakerphone would sound better.

With the pre-defined noise thresholds currently in the algorithm 41, if someone calls the user from an excessively noisy place (maybe a gym), the high background noise will make the speakerphone algorithm 41 think (falsely) that the far-end person is constantly talking, and consequently it would remain in the RX state 62 when neither person is talking (instead of in the Idle state 68). By making a slight modification to the speakerphone algorithm 41, to allow the noise thresholds to be variable instead of fixed, the speakerphone algorithm 41 would yield better performance in some cases. However, the preferred embodiment enjoys simplicity of design and operation, and thus does not implement the variable noise thresholds. The algorithm 41 simply compares the current volume levels to noise thresholds. The algorithm 41 doesn't care if the threshold is fixed or variable, it just needs to know what is the threshold at the time it makes the comparison.

Accordingly, it is appropriate that the foregoing description be construed broadly and understood as being given by way of illustration and example only, the spirit and scope of the invention being limited only by the appended claims.

What is claimed is:

1. A speakerphone, comprising:
   a base unit; and
   a portable handset communicatively coupled to the base unit via a wireless channel, including
   a microphone;
   a speaker;
   a first speech path to the speaker;
   a second speech path to the microphone;
   a first programmable digital level-adjustor adapted to be controlled to provide a gain adjustment along the first speech path;
   a second programmable digital level-adjustor adapted to be controlled to provide a gain adjustment along the second speech path;
   a logic decision circuit, coupled to the first and second programmable digital level-adjustors, adapted to alternately receive speech signals in the respective speech paths and determine regularly the respective peak amplitudes of signals in the first and second speech paths, and, in response, controlling the gains of the respective first and second speech paths during full duplex operation by controlling the first and second programmable digital level-adjustors and is further adapted to operate in a plurality of full duplex substates, each substate defining a different relationship between respective gains of the first and second speech paths.

2. A speakerphone arrangement, according to claim 1, wherein the substates include a first unbalanced gain relationship used in response to the speech volume of the first speech path that is less than the speech volume of the second speech path, and a second unbalanced gain relationship used in response to the speech volume of the first speech path that is greater than the speech volume of the second speech path.

3. A speakerphone arrangement, according to claim 1, wherein the substates include a balanced gain relationship, first unbalanced gain relationship used in response to the speech volume of the first speech path that is less than the speech volume of the second speech path, and a second unbalanced gain relationship used in response to the speech volume of the first speech path that is greater than the speech volume of the second speech path.

4. A speakerphone, comprising:
   a base unit; and
   a portable handset communicatively coupled to the base unit via a wireless channel, including
   a microphone;
   a speaker;
   a first speech path to the speaker;
   a second speech path to the microphone;
   a first programmable digital level-adjustor adapted to be controlled to provide a gain adjustment along the first speech path;
   a second programmable digital level-adjustor adapted to be controlled to provide a gain adjustment along the second speech path;
   a logic decision circuit, coupled to the first and second programmable digital level-adjustors, adapted to alternately receive speech signals in the respective speech paths and determine regularly the respective peak amplitudes of signals in the first and second speech paths, and, in response, controlling the gains of the respective first and second speech paths during full duplex operation by controlling the first and second programmable digital level-adjustors and is further adapted to operate in a plurality of full duplex substates, each substate defining a different relationship between respective gains of the first and second speech paths, one of the substates include a balanced gain relationship, another substate including a first unbalanced gain relationship used in response to the speech volume of the first speech path that is less than the speech volume of the second speech path, and another substate including a second unbalanced gain relationship used in response to the speech volume of the first speech path that is greater than the speech volume of the second speech path.

5. A speakerphone, comprising:
   a base unit; and
   a portable handset communicatively coupled to the base unit via a wireless channel, including
   a microphone;
   a speaker;
   a first speech path to the speaker;
   a second speech path to the microphone;
   a first programmable digital level-adjustor adapted to be controlled to provide a gain adjustment along the first speech path;
   a second programmable digital level-adjustor adapted to be controlled to provide a gain adjustment along the second speech path;
   a logic decision circuit, coupled to the first and second programmable digital level-adjustors, adapted to alternately receive speech signals in the respective speech paths and determine regularly the respective peak amplitudes of signals in the first and second speech paths, and, in response, controlling the gains of the respective first and second speech paths during full duplex operation by controlling the first and second programmable digital level-adjustors and is further adapted to operate in a plurality of full duplex substates, with the logic decision circuit transitioning between substates in response to: the volume levels in the first and second speech paths, and the current substate.

6. A speakerphone arrangement including a microphone and a speaker, comprising:
   a first speech path to the speaker;
   a second speech path to the microphone;
   a first level-adjustment means adapted to be controlled to adjust the volume along the first speech path;
   a second level-adjustment means adapted to be controlled to adjust the volume along the second speech path;
   means for alternately receiving speech signals in the respective speech paths and determining regularly the respective peak amplitudes of signals in the first and second speech paths, and in response controlling the gains of the respective first and second speech paths during full duplex operation by controlling the first and second level-adjustment means.

* * * * *